United States Patent [19]

Takeda

[11] Patent Number: 5,041,353
[45] Date of Patent: Aug. 20, 1991

[54] PROCESS FOR PREPARATION OF LIGHT-SENSITIVE MATERIAL CONTAINING SILVER HALIDE, REDUCING AGENT, PRECURSOR AND POLYMERIZABLE COMPOUND

[75] Inventor: Keiji Takeda, Kanagawa, Japan

[73] Assignee: Fuji Photo Film Co., Ltd., Kanagawa, Japan

[21] Appl. No.: 633,200

[22] Filed: Dec. 31, 1990

Related U.S. Application Data

[63] Continuation of Ser. No. 401,304, Aug. 31, 1989, abandoned.

[30] Foreign Application Priority Data

Aug. 31, 1988 [JP] Japan .................................. 63-218964
Jul. 14, 1989 [JP] Japan .................................. 1-182245

[51] Int. Cl.⁵ .......................... G03C 8/00; G03C 1/72
[52] U.S. Cl. ...................................... 430/138; 430/202; 430/203; 430/617; 430/619; 430/955
[58] Field of Search ............... 430/202, 203, 617, 619, 430/138, 955

[56] References Cited

U.S. PATENT DOCUMENTS

| | | | |
|---|---|---|---|
| 4,514,493 | 4/1985 | Hirai et al. | 430/617 |
| 4,649,098 | 3/1987 | Takeda | 430/270 |
| 4,758,496 | 7/1988 | Kakimi | 430/138 |
| 4,760,011 | 7/1988 | Kakimi | 430/138 |
| 4,792,514 | 12/1988 | Nakamura et al. | 430/138 |
| 4,888,265 | 12/1989 | Kakimi et al. | 430/138 |
| 4,897,335 | 1/1990 | Kakimi | 430/138 |
| 4,939,064 | 7/1990 | Nakamura | 430/138 |

FOREIGN PATENT DOCUMENTS 63-065437  3/1988  Japan .................................. 430/138

*Primary Examiner*—Charles L. Bowers, Jr.
*Assistant Examiner*—Tanis L. Dote
*Attorney, Agent, or Firm*—Sughrue, Mion, Zinn, Macpeak & Seas

[57] ABSTRACT

A process for preparation of a light-sensitive material is disclosed. The light-sensitive material comprises a support and a light-sensitive layer which contains light-sensitive silver halide, a reducing agent, a base precursor and an ethylenic unsaturated polymerizable compound. The process comprises emulsifying an aqueous dispersion of a base precursor in an oily medium containing the polymerizable compound in the range of 0.1 to 100 weight %.

20 Claims, 2 Drawing Sheets

PROCESS FOR PREPARATION OF LIGHT-SENSITIVE MATERIAL CONTAINING SILVER HALIDE, REDUCING AGENT, PRECURSOR AND POLYMERIZABLE COMPOUND

This is a continuation of application Ser. No. 07/401,304 filed Aug. 31, 1989, now abandoned.

FIELD OF THE INVENTION

The present invention relates to a process for preparation of a light-sensitive material which comprises a support and a light-sensitive layer containing silver halide, a reducing agent, a base precursor and a polymerizable compound.

BACKGROUND OF THE INVENTION

A light-sensitive material comprising a support and a light-sensitive layer containing light-sensitive silver halide, a reducing agent and a polymerizable compound is used in an image forming method which comprises imagewise polymerizing the polymerizable compound. The light-sensitive material is described in Japanese Patent Publications No. 45(1970)-11149 (corresponding to U.S. Pat. No. 3,697,275) and Japanese Patent Provisional Publications No. 1(1986)-69062 and No. 61(1986)-73145 (the contents of both publications are described in U.S. Pat. No. 4,629,676 and European Patent Provisional Publication No. 0174634A2).

The above-mentioned light-sensitive material has various embodiments with respect to the arrangement of the components of the light-sensitive layer. In a representative embodiment, the light-sensitive silver halide, the reducing agent and the polymerizable compound are contained in light-sensitive microcapsules which are dispersed in the light-sensitive layer. The light-sensitive microcapsule is disclosed in Japanese Patent Provisional Publications No. 62(1987)-169147 (corresponding to European Patent Provisional Publication No. 0224214A2), No. 62(1987)-169148, No. 62(1987)-209439 (corresponding to U.S. Pat. No. 4,824,756 and European Patent Provisional Publication No. 0237025A2) and No. 63(1988)-121837 (corresponding to U.S. patent application Ser. No. 119,449, now allowed).

In the above-mentioned publications, a base or base precursor is disclosed as an optional component of the light-sensitive material. The base or base precursor is an effective component which functions as an image formation accelerator in the image forming process (development process of the light-sensitive material).

It is technically difficult to incorporate the base or base precursor into the light-sensitive microcapsule. Therefore, the base or base precursor has been arranged outside of light-sensitive microcapsules in the light-sensitive layer. The base or base precursor permeates the light-sensitive microcapsules in a heat development process.

SUMMARY OF THE INVENTION

An object of the invention is to provide a process for preparation of a light-sensitive material containing a base precursor.

Another object of the invention is to provide a process for preparation of a light-sensitive material which is improved in the development speed and the sensitivity.

There is provided by the present invention a process for preparation of a light-sensitive material comprising a support and a light-sensitive layer provided thereon which contains light-sensitive silver halide, a reducing agent, a base precursor and an ethylenic unsaturated polymerizable compound, wherein the process includes a step of emulsifying an aqueous dispersion of the base precursor in an oily medium containing the polymerizable compound in the range of 0.1 to 100 weight %.

The present invention is characterized by the step of emulsifying an aqueous dispersion of the base precursor in an oily medium containing the polymerizable compound.

According to study of the present inventor, a base precursor can be finely and uniformly contained in an oily medium by emulsifying an aqueous dispersion of the base precursor in the oily medium containing a polymerizable compound. The present inventor has further found that the disperse phase of the base precursor (i.e., the phase of the emulsion of the aqueous dispersion) in the oily medium is very stable.

The base precursor which is contained in the oily medium in such fine and uniform disperse phase rapidly decomposes in a development process. In other words, the base precursor contained in such phase quickly forms a base. Accordingly, the base precursor rapidly accelerates the development reaction of the light-sensitive material prepared according to the present invention. Therefore, the light-sensitive material shows a high development speed and a high sensitivity.

DETAILED DESCRIPTION OF THE INVENTION

Figure 1:
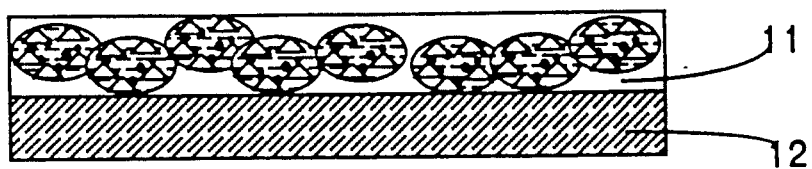
FIG. 1 to 5 are sectional views schematically illustrating various embodiments of the light-sensitive material prepared according to the present invention.

The light-sensitive material prepared according to the present invention comprises a support and a light-sensitive layer which contains light-sensitive silver halide, a reducing agent, a base precursor and a polymerizable compound.

The light-sensitive material has various embodiments with respect to the arrangement of the components of the light-sensitive layer. The characteristic step of the process for preparation of the present invention, namely the step of emulsifying an aqueous dispersion of the base precursor in an oily medium containing the polymerizable compound in the range of 0.1 to 100 weight % can be applied to any embodiment of the light-sensitive material.

The main five embodiments of the light-sensitive material and the process for preparation of the same are described hereinafter referring to the drawings.

FIG. 1 is a sectional view schematically illustrating the first embodiment of the light-sensitive material.

According to the first embodiment, a light-sensitive layer (11) is provided on a support (12). The light-sensitive layer (11) contains light-sensitive silver halide (A), a reducing agent, a base precursor (●) and a polymerizable compound. The light-sensitive silver halide, the base precursor and the polymerizable compound are contained in the oily medium, which is dispersed in the light-sensitive layer in the form of oily droplets. The reducing agent may be either contained in the oily droplets or arranged outside of the droplets.

The oily droplets are preferably in the form of microcapsules by forming shell around the droplets.

The first embodiment shown in FIG. 1 is prepared according to the process of the present invention, which comprises the steps of:

emulsifying an aqueous dispersion of the base precursor and a light-sensitive silver halide emulsion in an oily medium containing the polymerizable compound in the range of 0.1 to 100 weight %;

emulsifying the obtained oily emulsion in an aqueous medium; and coating the obtained aqueous emulsion on the support to form a light-sensitive layer.

The reducing agent is added to the oily medium, the aqueous dispersion of the base precursor, the light-sensitive silver halide emulsion, the oily emulsion, the aqueous medium or the aqueous emulsion.

It is preferred that the aqueous emulsion obtained by emulsifying the oily emulsion in an aqueous medium is subjected to a process for forming shell of microcapsules.

Figure 2:
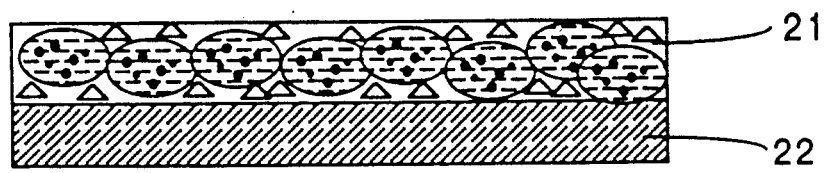

FIG. 2 is a sectional view schematically illustrating the second embodiment of the light-sensitive material.

According to the second embodiment, a light-sensitive layer (21) is provided on a support (22). The light-sensitive layer (21) contains light-sensitive silver halide (Δ), a reducing agent, a base precursor (•) and a polymerizable compound. The base precursor and the polymerizable compound are contained in the oily medium, which is dispersed in the light-sensitive layer in the form of oily droplets. The light-sensitive silver halide is arranged outside of the oily droplets in the light-sensitive layer. The reducing agent may be either contained in the oily droplets or arranged outside of the droplets.

The oily droplets are preferably in the form of microcapsules by forming shell around the droplets.

The second embodiment shown in FIG. 2 is prepared according to the process of the present invention, which comprises the steps of:

emulsifying an aqueous dispersion of the base precursor in an oily medium containing the polymerizable compound in the range of 0.1 to 100 weight %;

emulsifying the obtained oily emulsion in an aqueous medium containing a light-sensitive silver halide emulsion, or adding a light-sensitive silver halide emulsion to an aqueous emulsion obtained by emulsifying the oily emulsion in an aqueous medium; and coating the obtained aqueous emulsion on the support to form a light-sensitive layer.

The reducing agent is added to the oily medium, the aqueous dispersion of the base precursor, the light-sensitive silver halide emulsion, the oily emulsion, the aqueous medium or the aqueous emulsion.

It is preferred that the aqueous emulsion obtained by emulsifying the oily emulsion in an aqueous medium is subjected to a process for forming shell of microcapsules.

Figure 3:
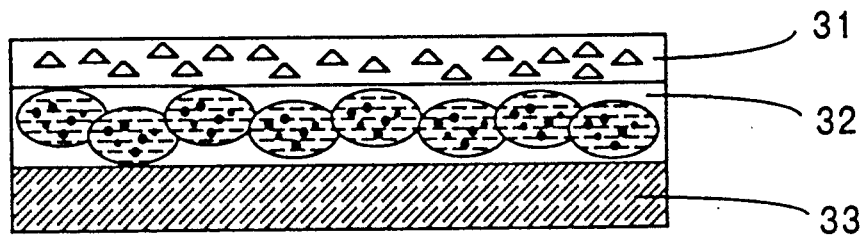

FIG. 3 is a sectional view schematically illustrating the third embodiment of the light-sensitive material.

According to the third embodiment, a first light-sensitive layer (31) and a second light-sensitive layer (32) are provided on a support (33). The first light-sensitive layer (31) contains light-sensitive silver halide (Δ). The second light-sensitive layer (32) contains a base precursor (•) and a polymerizable compound. The base precursor and the polymerizable compound are contained in the oily medium, which is dispersed in the second light-sensitive layer in the form of oily droplets. The reducing agent may be either contained in the oily droplets, arranged outside of the droplets in the second light-sensitive layer, or contained in the first light-sensitive layer.

The second light-sensitive layer containing the base precursor and the polymerizable compound may be arranged on the first light-sensitive layer containing the light-sensitive silver halide. However, it is preferred to arrange the first light-sensitive layer on the second light-sensitive layer as is shown in FIG. 3.

The oily droplets are preferably in the form of microcapsules by forming shell around the droplets.

The third embodiment shown in FIG. 3 is prepared according to the process of the present invention, which comprises the steps of:

emulsifying an aqueous dispersion of the base precursor in an oily medium containing the polymerizable compound in the range of 0.1 to 100 weight %;

emulsifying the obtained oily emulsion in an aqueous medium;

coating the obtained aqueous emulsion on the support to form a second light-sensitive layer; and coating a light-sensitive silver halide emulsion on the coated second light-sensitive layer to form a first light-sensitive layer.

Alternatively, the last two steps may comprises coating a light-sensitive silver halide emulsion on a support to form a first light-sensitive layer; and coating the aqueous emulsion on the first light-sensitive layer to form a second light-sensitive layer.

The reducing agent is added to the oily medium, the aqueous dispersion of the base precursor, the light-sensitive silver halide emulsion, the oily emulsion, the aqueous medium or the aqueous emulsion.

It is preferred that the aqueous emulsion obtained by emulsifying the oily emulsion in an aqueous medium is subjected to a process for forming shell of microcapsules.

Figure 4:
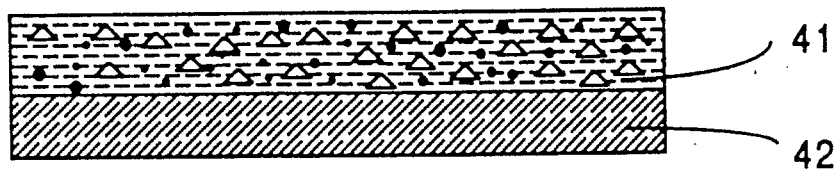

FIG. 4 is a sectional view schematically illustrating the fourth embodiment of the light-sensitive material.

According to the fourth embodiment, a light-sensitive layer (41) is provided on a support (42). The light-sensitive layer (41) comprises an oily medium containing light-sensitive silver halide (Δ), a reducing agent, a base precursor (•) and a polymerizable compound.

The fourth embodiment shown in FIG. 4 is prepared according to the process of the present invention, which comprises the steps of:

emulsifying an aqueous dispersion of the base precursor and a light-sensitive silver halide emulsion in an oily medium containing the polymerizable compound in the range of 0.1 to 100 weight %; and coating the obtained oily emulsion on the support to form a light-sensitive layer.

The reducing agent is added to the oily medium, the aqueous dispersion of the base precursor, the light-sensitive silver halide emulsion or the oily emulsion.

It is preferred that the oily medium contains an oil-soluble polymer in the range of 0.1 to 90 weight %.

Figure 5:
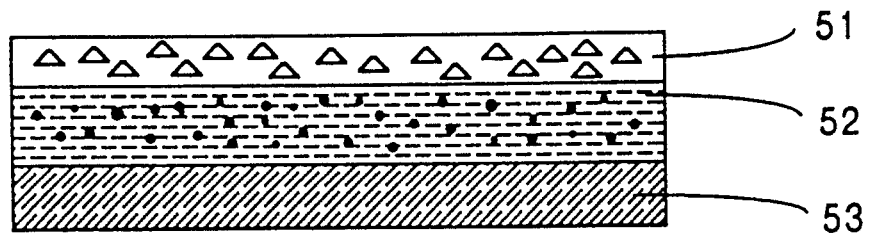

FIG. 5 is a sectional view schematically illustrating the fifth embodiment of the light-sensitive material.

According to the fifth embodiment, a first light-sensitive layer (51) and a second light-sensitive layer (52) are provided on a support (53). The first light-sensitive layer (51) contains light-sensitive silver halide (Δ). The second light-sensitive layer (52) comprises an oily medium containing a base precursor (•) and a polymerizable compound. The reducing agent may be either contained in the first light-sensitive layer, or contained in the second light-sensitive layer.

The second light-sensitive layer containing the base precursor and the polymerizable compound may be arranged on the first light-sensitive layer containing the light-sensitive silver halide. However, it is preferred to arrange the first light-sensitive layer on the second light-sensitive layer as is shown in FIG. 5.

The fifth embodiment shown in FIG. 5 is prepared according to the process of the present invention, which comprises the steps of:

emulsifying an aqueous dispersion of the base precursor in an oily medium containing the polymerizable compound in the range of 0.1 to 100 weight %; and coating the obtained oily emulsion on the support to form a second light-sensitive layer; and coating a light-sensitive silver halide emulsion on the coated second light-sensitive layer to form a first light-sensitive layer.

Alternatively, the last two steps may comprises coating a light-sensitive silver halide emulsion on a support to form a first light-sensitive layer; and coating the oily emulsion on the first light-sensitive layer to form a second light-sensitive layer.

The reducing agent is added to the oily medium, the aqueous dispersion of the base precursor, the light-sensitive silver halide emulsion or the oily emulsion.

It is preferred that the oily medium contains an oil-soluble polymer in the range of 0.1 to 90 weight %.

The characteristic step of the process of the present invention, namely the step of emulsifying an aqueous dispersion of the base precursor in an oily medium containing the polymerizable compound in the range of 0.1 to 100 weight % is described below.

In the present specification, the term "oily medium" means a hydrophobic liquid which is substantially not miscible with water. An ethylenic unsaturated polymerizable compound (the details are described later) usually is the above-defined liquid. Therefore, the polymerizable compound itself may be used as the oily medium (i.e., the polymerizable compound may be 100 weight % of the oily medium).

The oily medium may contain a hydrophobic component other than the polymerizable compound. The hydrophobic component to be added to the oily medium preferably is an oil-soluble polymer and/or an organic solvent.

Examples of the oil-soluble polymer used in the present invention include poly(meth)acrylate, polyvinyl butyral, polyvinylformal, polyvinyl pyrrolidone, polyvinyl acetate, vinyl acetate/ethylene copolymer, polyvinyl chloride, polyvinylidene chloride, vinyl chloride/vinylidene chloride copolymer, vinylidene chloride/acrylonitrile copolymer, chlorinated polyethylene, chlorinated polypropylene, polycarbonate, cellulose diacetate, cellulose acetate butylate, cellulose triacetate, ethyl cellulose, polyvinyl pyridine and polyvinyl imidazole.

A polymer having a cross-linkable ethylenic unsaturated bond in its side chain is preferably used as the oil-soluble polymer. Examples of such polymer include a homopolymer or a copolymer of aryl (meth)acrylate, hydroxyethyl (meth)acrylate and maleic anhydride. The polymer having an ethylenic unsaturated bond in its side chain is disclosed in Japanese Patent Provisional Publication No. 64(1989)-17047.

The molecular weight of the oil-soluble polymer is preferably in the range of 10,000 to 500,000.

A copolymer consisting of hydrophilic repeating unit and hydrophobic repeating unit may be used as the oil-soluble polymer.

In the fourth and fifth embodiments (namely, the embodiments prepared by directly coating an organic medium on a support), the above mentioned oil-soluble polymer functions as a binder. Therefore, a relatively large amount of the oil-soluble polymer is preferably used in the fourth and fifth embodiments. In more detail, the oily medium of the fourth and fifth embodiments preferably contains an oil-soluble polymer in the range of 0.1 to 90 weight % (more preferably 1 to 90 weight %).

The organic solvent preferably has a function of dissolving both of the polymerizable compound and the oil-soluble polymer. Examples of the organic solvent include acetone, methyl ethyl ketone, methyl cellosolve, propylene glycol monomethyl ether, ethylene glycol, methanol, ethanol, isopropanol, dimethylformamide, toluene and xylene.

The base precursor is preferably contained in the aqueous dispersion in the range of 1 to 90 weight % (more preferably 40 to 90 weight %).

The base precursor preferably is in the form of solid particles having a mean particle size in the range of 0.01 to 30 μm (more preferably 0.05 to 5 μm).

A hydrophilic polymer is preferably dissolved in the aqueous dispersion of the base precursor. Examples of the hydrophilic polymer include gelatin, a cellulose derivative, starch, gum arabic, polyvinyl alcohol, polyvinyl pyrrolidone, polyacrylamide, polymethacrylamide and polystyrenesulfinic acid. The hydrophilic polymer is preferably used as 0.1 to 70 weight % aqueous solution.

According to the process of the present invention, the above-mentioned aqueous dispersion of the base precursor is emulsified in the oily medium. The aqueous dispersion of the base precursor emulsified in the oily medium is preferably in the form of droplets having a mean droplet size in the range of 0.1 to 100 μm (more preferably 0.5 to 10 μm).

In the process of the present invention, the base precursor is preferably used in an amount of 0.5 to 200 weight based on the amount of the polymerizable compound, and more preferably in an amount of 3 to 30 weight %.

The components of the light-sensitive layer used in the process of the present invention are described below.

Light-sensitive silver halide

Examples of the light-sensitive silver halide include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Pat. No. 4,433,048, and European Patent No. 100,984.

There is no specific limitation on the crystal habit of silver halide grains. Two or more kinds of silver halide grains which differ in halogen composition, crystal habit, grain size, and/or other features from each other can be employed in combination. There is no specific limitation on the grain size distribution of silver halide grains.

The silver halide grains preferably have a mean grain size of 0.001 to 5 μm, more preferably 0.001 to 2 μm.

The light-sensitive silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts of the silver salt and halogen salt to be added or the rate of their addition can be increased as is described in Japanese Patent Provisional Publications Nos. 55(1980)-142329 and 55(1980)-158124 and U.S. Pat. No. 3,650,757.

The light-sensitive silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 58(1983)-136641. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, hydrophilic colloids are advantageously used as protective colloids. Examples of hydrophilic colloids include proteins (e.g., gelatin, gelatin derivatives, gelatin grafted with other polymers, albumin and casein), cellulose derivatives (e.g., hydroxyethyl cellulose, carboxymethyl cellulose and cellulose sulfate), saccharide derivatives (e.g., sodium alginate and starch derivative), and a wide variety of synthetic hydrophilic polymers, such as polyvinyl alcohol, polyvinyl alcohol partial acetal, poly-N-vinylpyrrolidone polyacrylic acid, polymethacrylic acid, polyacrylamide, polyvinylimidazole, and polyvinylpyrazole and copolymers comprising monomers constituting these homopolymers. Gelatin is most preferred. Examples of the employable gelatin include not only lime-treated gelatin but also acid-treated gelatin and enzyme-treated gelatin. Hydrolysis products or enzymatic decomposition products of gelatin can be also employed.

In the formation of silver halide grains in the light-sensitive silver halide emulsion, ammonia, an organic thioether derivative (see: Japanese Patent Publication No. 47(1972)-386) or sulfur containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The light-sensitive silver halide emulsion may be used in the primitive condition, but is usually subjected to chemical sensitization. For the chemical sensitization of the emulsion employable for the conventional photographic material, there can be employed sulfur sensitization, reduction sensitization or noble metal sensitization, etc, singly or in combination. Those chemical sensitization processes can be carried out in the presence of a nitrogen-containing heterocyclic compound as described in Japanese Patent Provisional Publications Nos.58(1983)-126526 and 58(1983)-215644.

When a sensitizing dye is added to the light-sensitive silver halide emulsion, the sensitizing dye is preferably added during the stage of preparation of the emulsion. When the nitrogen-containing heterocyclic compound functioning as an antifogging agent and/or a development accelerator is added to the silver halide emulsion, the compound is preferably added during the stage of the formation or ripening of the silver halide grains.

When an organic silver salt is contained in the light-sensitive layer, the emulsion of the organic silver salt can be prepared in the similar manner to that in the preparation of the light-sensitive silver halide emulsion.

The amount of the silver halide grains contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 0.1 g/m$^2$, more preferably in the range of 1 to 90 mg/m$^2$, in terms of silver only contained in the silver halide.

There is no specific limitation with respect to the sensitizing dyes, and any known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonoldyes. These sensitizing dyes can be employed singly or in combination, but two or more sensitizing dyes are generally employed in combination for the purpose of supersensitization. In addition to the sensitizing dye, a substance which does not per se exhibit spectral sensitization effect or does not substantially absorb visible light but shows supersensitizing activity can be employed.

The amount of the sensitizing dye to be added generally ranges from approx. $10^{-8}$ to $10^{-2}$ mole per 1 mole of the silver halide.

Adding of an organic silver salt to the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably located in contact with the silver halide or closely to the silver halide. Examples of organic compounds employable for forming such organic silver salt include aliphatic or aromatic carboxylic acids, thiocarbonyl group-containing compounds having a mercapto group or an α-hydrogen atom, and imino group-containing compounds. Benztriazoles are most preferred. The organic silver salt is generally used in an amount of from 0.01 to 10 mole, preferably from 0.1 to 1 mole, per 1 mole of the silver halide. Instead of the organic silver salt, an organic compound (i.e., benzotriazole) which can form an organic silver salt in combination with an inorganic silver salt can be added to the light-sensitive layer to obtain the same effect.

The compounds functioning as an antifogging agent and/or a development accelerator can be used. Examples of the compounds functioning as an antifogging agent and/or a development accelerator include a conventional antifogging agent described in Japanese Patent Provisional Publication No. 62(1987)-151838; a compound having a cyclic amido structure described in Japanese Patent Provisional Publication No. 61(1986)-151841; a thioether compound described in Japanese Patent Provisional Publication No. 62(1987)-151842; a polyethylene glycol derivative described in Japanese Patent Provisional Publication No. 62(1987)-151843; a thiol derivative described in Japanese Patent Provisional Publication No,. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

Reducing agent

In the present specification, the reducing agent is a compound having a function of reducing the silver halide and a function of accelerating (or restraining) polymerization of the polymerizable compound. Two or more compound which have the above-mentioned functions respectively can be used as the reducing agent.

Examples of the reducing agent having the above-mentioned functions include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamido-phenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

Depending on the nature or the amount of the reducing agent, the polymerizable compound within either the area where a latent image of the silver halide has been formed or the area where a latent image of the silver halide as not been formed can be polymerized. For example, when a hydrazines are used as the reducing agent, the polymerization reaction proceeds within the area where a latent image of the silver halide has been formed. Further, when 1-phenyl-3-pyrazolidones are used as the reducing agent and a polymerization initiator (which has a function of being decomposed to uniformly form a radical when it is heated or irradiated with light) is used together with the reducing agent, the polymerization reaction proceeds within the area where a latent image of the silver halide has not been formed. The latter method is described in Japanese Patent Provisional Publications No. 61(1986)-75342, No. 61(1986)-243449, No. 62(1987)-70836, No. 62(1987)-81635, U.S. Pat. No. 4,649,098 and European Patent No. 0202490B1.

The above-mentioned reducing agents (including compounds referred to as developing agent or hydrazine derivative) are described in Japanese Patent Provisional Publications No. 61(1986)-183640, No. 61(1986)-188535, No. 61(1986)-228441, No. 62(1987)-86354, No. 62(1987)-86355, No. 62(1987)-264041 and No. 62(1987)-198849. The reducing agent is also described in T. James, "The Theory of the Photographic Process", 4th edition, pp. 291–334 (1977), Research Disclosure Vol. 170, No. 17029, pp. 9–15 (June 978), and Research Disclosure Vol. 176, No. 17643, pp. 22–31 (December 1978).

A precursor of a reducing agent which releases the reducing agent when it is heated or in contact with a base can be used in place of the reducing agent.

These reducing agents can be used singly or in combination. In the case that two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation reduction reaction with the other reducing agent. Both interactions may occur simultaneously, so that it is difficult to determine which of the interactions has occurred in practical use.

Concrete examples of the reducing agents include pentadecylhydroquinone, 5-t-butylcatechol, p-(N,N-diethylamino)phenol, 1-phenyl-3-pyrazolidone, 5-phenyl-3-pyrazolidone, 1,5-diphenyl-3-pyrazolidone, 1-phenyl-4-methyl-4-hydoroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonyl-amino-4-t-butyl-5-hexadecyloxyphenol 2-(N-butylcarbamoyl)-4-phenylsulfonylaminonaphthol, 2-(N-methyl-N-octadecylcarbamoyl)-4-sulfonylaminonaphthol, 1-acetyl-2-phenylhydrazine, 1-formyl-2-(2-methoxyphenyl)hydrazine, 1-formyl-2-(2-chlorophenyl)hydrazine, 1-formyl-2-(2-butoxyphenyl)hydrazine, 1-(3,5-dichlorobenzoyl)-2-(2-chlorophenyl)hydrazine, 1-acetyl-2-phenylhydrazine, 1-acetyl-2-{(p- or o-)aminophenyl}hydrazine, 1-formyl-2-{(p- or o)-aminophenyl}hydrazine, 1-acetyl-2-{(p- or o)methoxy-phenyl}hydrazine, 1-lauroyl-2-{(p- or o-) aminophenyl}hydrazine, 1-trityl- 2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)-butyloyl}-2-(p- or o-aminophenyl)hydrazine pentadecylfluorocaprylate salt, 3-indazolinone, 1-trityl-2-[{(2-N-butyl-N-octylsulfamoyl)-4-methanesulfonyl} phenyl]hydrazine, 1-{4-(2,5-di-tert-pentylphenoxy)-butyloyl}-2-(p- or o- methoxyphenyl)hydrazine, 1-(methoxycarbonylbenzohydryl)-2-phenylhydrazine, 1-formyl-2-[4-{2-(2,4-di-tert-pentylphenoxy)butylamide} phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl} phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-

2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on 1 mole of silver (including the above mentioned silver halide and the optional organic silver salt).

Polymerizable compound

There is no specific limitation with respect to the polymerizable compound, except that the compound has an ethylenic unsaturated bond. Any known ethylenic unsaturated polymerizable compounds can be employed in the invention. In the case that a heat development (thermal development) is employed for developing the light-sensitive material, the polymerizable compound having a relatively higher boiling point (e.g., 80° C. or higher) that are hardly evaporated upon heating are preferably employed. The polymerizable compounds are preferably cross-linkable compounds having plural polymerizable groups in the molecule.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropion aldehyde and pentaerythritol condensate, polyacrylate of hydroxypolyether, polyester acrylate, diacrylate of polyoxyethylenated bisphenol F, polyurethane acrylate, polyethyleneglycol diacrylate, polypropyleneglycol diacrylate. The methacrylic esters which are formed by replacing the acryloyl groups of the above-mentioned acrylic esters with methacryloyl groups are also used as the polymerizable compound. The acryloyl groups may be partially replaced with the methacryloyl groups. These polymerizable compounds are commercially available. Examples are KAYARAD R-604, R-684, R-712, R-310, R-167 and HX200 (produced by Nippon Kayaku Kogyo Co., Ltd.), ARONIX M-309, M-310, M-400 and M-210 (produced by Toagosei Chemical Industry Co., Ltd.).

The polymerizable compounds can be used singly or in combination of two or more compounds.

The amount of the polymerizable compound to be contained in the light-sensitive layer preferably ranges from 5 to 100,000 parts by weight, and more preferably from 10 to 10,000 parts by weight, per one part by weight of the light-sensitive silver halide.

Preparation of oily emulsion

A copolymer consisting of hydrophilic repeating unit and hydrophobic repeating unit is preferably used to finely and uniformly emulsify an aqueous liquid (such as the silver halide emulsion and the aqueous dispersion of the base precursor) in the oily medium (containing the polymerizable compound). The copolymers are described in Japanese Patent Provisional Publications No. 62(1987)-209449 and NO. 63(1988)-287844.

The oily emulsion can be also prepared by dispersing microcapsules containing silver halide emulsion as a core material in the polymerizable compound instead of employing the above copolymer, as is described in Japanese Patent Provisional Publication No. 62(1987)-164041.

Base precursor

The base precursors preferably are compounds capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by a reaction under a heating condition.

Examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenylsulfonylacetate, guanidine 4-methylsulfonylphenylsulfonylacetate and guanidine 4-acetylaminomethyl propionate.

The base precursor preferably is a salt of an organic base with a carboxylic acid. The organic base preferably is a diacidic to tetraacidic base which is composed of two to four amidine moieties and at least one residue of a hydrocarbon or a heterocyclic ring as a linking group for the amidine moieties, said amidine moiety corresponding to an atomic group formed by removing one or two hydrogen atoms from an amidine having the following formula (I).

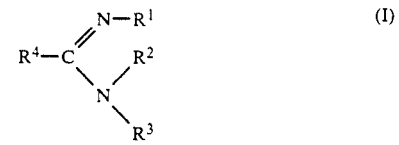

In the formula (I), each of $R^1$, $R^2$, $R^3$ and $R^4$ independently is a monovalent group selected from the group consisting of hydrogen, an alkyl group, an alkenyl group, an alkynyl group, a cycloalkyl group, an aralkyl group, an aryl group and a heterocyclic group. Hydrogen, an alkyl group, a cycloalkyl group, an aralkyl group and an aryl group are preferred. Each of $R^1$, $R^2$, $R^3$ and $R^4$ may have one or more substituent groups. The alkyl group, the alkenyl group and the alkynyl group preferably has 1-6 carbon atoms. Example of the cycloalkyl group is cyclohexyl. Example of the aralkyl group is benzyl. Example of the aryl group is phenyl.

Any two of $R^1$, $R^2$, $R^3$ and $R^4$ may be combined together to form a five-membered or six-membered heterocyclic ring consisting of nitrogen and carbon atoms. It is preferred that $R^1$ and $R^2$ are combined together to form an cyclic amidine having the following formula (I-2).

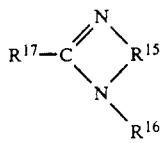

(I-2)

In the formula (I-2), $R^{17}$ is a divalent group selected from the group consisting of ethylene, propylene, trimethylene, vinylene and propenylene. Each of the divalent groups may have one or more substituent groups. Ethylene, propylene and trimethylene are preferred. Therefore, the cyclic amidine having the formula (I-2) preferably is 2-imidazoline, 1,4,5,6-tetrahydropyrimidine or a derivative thereof, and more preferably is 1,4,5,6-tetrahydropyrimidine or a derivative thereof.

$R^{16}$ has the same meaning as in $R^3$ of the formula (I). It is particularly preferred that $R^{16}$ is hydrogen or an alkyl group.

$R^{17}$ has the same meaning as in $R^4$ of the formula (I). It is particularly preferred that $R^{17}$ is hydrogen.

Another heterocyclic ring, aliphatic ring (e.g., cyclohexane) and/or aromatic ring may be condensed with the cyclic amidine having the formula (I-2).

The above-mentioned base precursor is described in Japanese Patent Provisional Publication No. 63(1988)-316760.

The organic base also preferably is a diacidic to tetraacidic base which is composed of two to four guanidine moieties and at least one residue of a hydrocarbon or a heterocyclic ring as a linking group for the guanidine moieties, the number of carbon atoms contained in said organic base being not more than six times the number of the guanidine moieties, and said guanidine moiety corresponding to an atomic group formed by removing one or two hydrogen atoms from a compound having the following formula (IV).

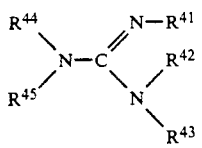

(IV)

In the formula (IV), each of $R^{41}$, $R^{42}$, $R^{43}$, $R^{44}$ and $R^{45}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{41}$, $R^{42}$, $R^{43}$, $R^{44}$ and $R^{45}$ may be combined together to form a five-membered or six-membered heterocyclic ring.

The above-mentioned base precursor is described in Japanese Patent Provisional Publication No. 64(1989)-68746.

According to the present invention, the base precursor preferably is a compound which is not soluble or slightly soluble in each of water and the oily medium. In more detail, the base precursor preferably has a solubility of not more than 10% (more preferably not more than 3%) in each of water and the oily medium.

Color image forming substance

A color image can be obtained on the light-sensitive layer by incorporating a color image forming substance as an optional component into the light-sensitive layer.

Known colored substances (i.e., dyes and pigments) can be used as the color image forming substance. There is no specific limitation with respect to the nature, hue and amount of the colored substance. The colored substance can also function as an antihalation or antiirradiation dye.

Non-colored or almost non-colored substance (i.e., color former or dye- or pigment-precursor) which develops to give a color under application of external energy (e.g., heating, pressing, light irradiation) can also be used as the color image forming substance. Examples of the such substances include thermochromic compounds piezochromic compounds, photochromic compounds and leuco compounds derived from triarylmethane dyes, quinone dyes, indigoid dyes, azine dyes.

Further, non-colored or almost non-colored substance which develops to give a color by contact with other components (i.e., developer) can be used as the color image forming substance. Examples of such substances include various compounds capable of developing a color through some reaction between two or more components, such as acid-base reaction, oxidation-reduction reaction, coupling reaction, chelating reaction. Examples of color formation systems are described in Hiroyuki Moriga, "Introduction of Chemistry of Speciality Paper" (in Japanese, 1975), pp. 29–58 (pressure-sensitive copying paper, [pp. 87–95 (azo-graphy) or pp. 118–120 (heat-sensitive color formation by a chemical change).

Examples of the color formation systems specifically include a color formation system used in pressure-sensitive papers, etc., comprising a color former having a partial structure of lactone, lactam, spiropyran, etc., and an acidic substance (developer), e.g., acid clay, phenol; a system utilizing azo-coupling reaction between an aromatic a diazonium salt, diazotate or diazosulfonate and naphthol, aniline, active methylene; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol.

The color image forming substance is preferably used in an amount of 0.5 to 30 parts by weight per 100 parts by weight of the polymerizable compound.

Polymerization initiator

When the oxidized product of the reducing agent has a function of restraining a polymerization reaction (for example the reducing agent is 1-phenyl-3-pyrazolidones), the polymerization reaction proceeds within the area where a latent image of the silver halide has not been formed. In such system, a thermal polymerization initiator or a photopolymerization initiator (which has a function of being decomposed to uniformly form a radical) is preferably used together with the reducing agent.

The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds (e.g., azobisisobutyronitrile, 1,1'-azobis-(1-cyclohexanecarbonitrile)., dimethyl 2,2'-azobisiso-butyrate, 2,2'-azobis(2-methylbutyronitrile), and azobis-dimethylvaleronitrile), organic peroxides (e.g., benzoyl peroxide, di-tert-butyl peroxide, dicumyl peroxide, tert-butyl hydroperoxide, and cumene hydroperoxide), inorganic peroxides (e.g., hydrogen peroxide, potassium persulfate, and ammonium persulfate), and sodium p-toluenesulfinate.

The photopolymerization initiators are described in Oster et al "Chemical Review", p. 125–151, vol. 68 (1968) and Kosar "Light-Sensitive System", p. 158–193 (John Willey & Sons, 1965). Examples of the photopolymerization initiators include carbonyl compounds (e.g., $\alpha$-alkoxyphenylketones, polycyclic quinones, benzophenones, substituted benzophenones, xanthones, thioxanthones, benzoins), halide compounds (e.g., chlorosulfonyl polynuclear aromatic compounds, chloromethyl polynuclear aromatic compounds, chlorosulfonyl heterocyclic compounds, chloromethyl heterocyclic compounds, chlorosulfonylbenzophenones, chloromethylbenzophenones, fluorenones), haloalkanes, $\alpha$-halo-$\alpha$-phenylacetophenones, redox couples of photo reducible dye and reducing agent (both of examples are described below), organic sulfur compounds, peroxides, photosemiconductors (e.g., titanium dioxide, zinc oxide), metallic compounds (e.g., iron (I) salt, metallic carbonyl, metal complex, uranyl salt), azo compounds, diazo compounds and combinations of ionized dye and a counter ion (described in U.S. Pat. No. 4,772,530).

Concrete examples of the photopolymerization initiator include 2,2-dimethoxy-2-phenylacetophenone, 2-methyl-{4-methylthio)phenyl}-2-morpholino-1-propanone, benzoinbutyl ether, benzoinisopropyl ether, benzophenone, Michler's ketone, 4,4'-diethylaminobenzophenone, chloromethylbenzophenone, chlorosulfonylbenzophenone, 9,10-anthraquinone, 1-methyl-9,10-anthraquinone, chloroslfonylanthrazuinone, chloromethylanthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorenone and carbon tetrabromide.

Examples of the photo reducible dye include Methylene Blue, Thionine, Rose Bengal, Erythrosine B, Eosine, Rhodamine, Phloxine B, Safranine, acryflavine, riboflavin, fluoresceine, uranine, benzoflavin, Acridine Orange, Acridine Yellow and benzanthrone.

Examples of the reducing agent (hydrogen donor) include $\beta$-diketones (e.g., dimedone, acetylacetone), amines (triethanolamine, diethanolamine, monoethanolamine, diethylamine, triethylamine), sulfinic acids and the salt thereof (e.g., p-toluenesulfinic acid, benzenesulfinic acid), N-phenylglycine, L-ascorbic acid and the salt thereof, thiourea and arylthioureas. The ratio of the photo reducible dye to the reducing agent is preferably in the range of 1:0.1 to 1:10.

The photopolymerization initiators are commercially available. Examples are Irgacure 651 and Irgacure 907 (produced by Ciba Geigy).

The polymerization initiator is preferably used in an amount of from 0.001 to 0.5 g, more preferably from 0.01 to 0.2 g, based on 1 g of the polymerizable compound.

Support

Examples of the material employable for the support include paper, synthetic paper, laminated paper (e.g., paper laminated with polyethylene, polypropylene or polystyrene), plastic film (e.g., polyethylene terephthalate, polycarbonate, polyimide, polyamide, cellulose triacetate), metal sheet (e.g., aluminum, aluminum alloy, zinc, iron, copper) and paper or plastic film laminated with the metal sheet.

Preparation of microcapsule

It is preferred that the aqueous emulsion obtained by emulsifying the oily emulsion (light-sensitive composition) in an aqueous medium is subjected to a process for forming shells of microcapsules. The aqueous medium preferably contains a water-soluble polymer as a protective colloid of the microcapsules.

Examples of the processes for preparing microcapsules (encapsulation processes) include a process utilizing coacervation of a hydrophilic shell material as described in U.S. Pat. Nos. 2,800,457 and 2,800,458; an interface polymerization process as described in U.S. Pat. No. 3,287,154, British Patent No. 990,443 and Japanese Patent Publications No. 38(1963)-19574, No. 42(1967)-446 and No. 42(1967)-771; a polymer deposition process as described in U.S. Pat. Nos. 3,418,250 and 3,660,304; a process using an isocyanate-polyol shell material as described in U.S. Pat. No. 3,796,669; a process using an isocyanate shell material as described in U.S. Pat. No. 3,914,511; a process using an urea-formaldehyde or urea-formaldehyde-resorcinol shell material as described in U.S. Pat. Nos. 4,001,140, 4,087,376 and 4,089,802; a process using a shell material such as melamine-formaldehyde resin or hydroxypropyl cellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in U.K. Patents No. 927,807 and No. 965,074; and a spray-drying process as described in U.S. Pat. No. 3,111,407 and U.K. Patent No. 930,422.

The shell material of the microcapsule is preferably made of polyamide resin and/or polyester resin, polyurea resin and/or polyurethane resin, amino-aldehyde resin, gelatin, epoxy resin, complex resin of polyamide and polyurea resin, or complex resin of polyurethane and polyester.

The mean particle size of the microcapsules preferably is in the range of 3 to 20 $\mu$m.

At least 70 weight % of the silver halide contained in the microcapsules is preferably arranged in the shell material of the microcapsule. The mean grain size of the silver halide contained in the microcapsules preferably is not more than one fifth parts of the mean size of the microcapsules. It is preferred that one microcapsule contains at least five silver halide grains.

Image-receiving material

The image-receiving material is usually prepared by providing an image-receiving layer on the support. The image-receiving layer can be constructed using a variety of compounds according to the color formation system. For example, when a color formation system using a color former and a developer is employed, the developer can be contained in the image-receiving layer. When a dye or pigment is used as a color image forming substance, the image-receiving layer can contain a mordant. The mordant can be selected from various compounds which are known in the art of the conventional photography.

The image-receiving layer preferably contains a polymer as a binder. The binder which is employable for the aforementioned light-sensitive layer can be also employed for the image-receiving layer.

The image-receiving layer can contain fine particles. The fine particles may be made of colorless inorganic pigment such as calcium carbonate, titanium dioxide, zinc oxide and barium sulfate. The fine particles may also be made of a thermoplastic compound, such as polymer (e.g., polyethylene, polypropylene and polytetrafluoroethylene), and waxes, as is described in Japanese Patent Provisional Publications No. 62(1987)-280071 and No. 62(1987)-280739. These fine particles increase the void volume of the image-receiving layer to further increase the density of the color, since such image-receiving layer absorbs a large amount of an oily medium. In the case that the fine particles are made of a thermoplastic compound, the image receiving layer can be heated after an image transfer process to obtain a glossy or transparent image. Further, two or more binders which are not miscible with each other can be used to causes a phase separation in a image-receiving layer. The image-receiving layer in which the phase separation has been caused has a high void volume and give an image having a high density of the color.

The thickness of the image-receiving layer preferably ranges from 0.1 to 100 μm, more preferably from 1 to 20 μm.

As the support of the image-receiving material, various materials as the support of the light-sensitive material are also employable.

Image forming process

The image forming method (namely use of the light-sensitive material) comprises imagewise exposing to light the light-sensitive material and heating the light-sensitive material. When the light-sensitive material is heated, the polymerizable compound within the area where a latent image of silver halide has been formed (or the area where a latent image of silver halide has not been formed) is polymerized and thereby the oily droplets or microcapsules are cured. Then, the light-sensitive material is pressed on an image-receiving material to transfer the unpolymerized polymerizable compound to the image-receiving material. Thus, an image can be formed on the image-receiving material. Alternatively, after the light-sensitive material is heated, the unpolymerized polymerizable compound is removed by a solvent (e.g., water, an alkali, an acid, an organic solvent) to form an image on the light-sensitive material. The embodiments of the light-sensitive material shown in FIG. 1–3 are preferably used in the former process (using an image-receiving material), and the embodiments shown in FIG. 4 and 5 are preferably used in the latter process (using a solvent).

The kind of light source is selected depending on the light-sensitive wavelength determined by spectral sensitization or sensitivity of the silver halide. Examples of the light source include various lamps (e.g., tungsten lamp, halogen lamp, xenon lamp, carbon arc lamp), various lasers (e.g., semiconductor laser, helium laser, argon laser, helium-cadmium laser), light emitting diodes and CRT light sources. The wavelength of the light is usually included within the visible, near ultraviolet or near infrared region. The amount of light is determined by the sensitivity of the silver halide, and is usually in the range of 0.01 to 10,000 ergs/cm$^2$, preferably in the range of 0.1 to 1,000 ergs/cm$^2$.

Heating in the heat development process can be conducted in various known manners. For example, the light-sensitive material may be placed on a hot plate or passed through heated rollers. Further, the light-sensitive material may be heated by heat radiation using an infrared lamp. Furthermore, the light-sensitive material may be immersed in a heated medium (e.g., oil). The surface of the light-sensitive material is preferably covered with an oxygen-impermeable sheet when the light-sensitive material is heated. For example, the light-sensitive layer is preferably pressed on the surface of the heating means. Heating temperature usually ranges from 80° C. to 200° C., and preferably from 100° C. to 150° C. The heating time is usually from 1 to 180 seconds, and preferably from 5 to 60 seconds.

The present invention is further described by the following examples without limiting the invention.

EXAMPLE 1

Preparation of aqueous dispersion of base precursor

In 800 g of 3 weight % aqueous solution of polyvinyl alcohol was dispersed 200 g of powder of the following base precursor (almost insoluble in water) using Dyno-mill dispersing device. The mean particle size of the base precursor was not more than 0.5 μm.

With 200 g of water was mixed 100 g of the dispersion, and the mixture was condensed using a centrifuge to obtain 64 weight % aqueous dispersion of the base precursor.

(Base precursor)

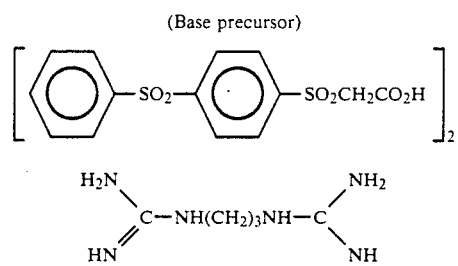

Preparation of silver halide emulsion (A)

In 1,500 ml of water were dissolved 16 g of gelatin and 0.5 g of sodium chloride, and the resulting gelatin solution was adjusted to pH 3.2 using 1N sulfuric acid and kept at 50° C. To the gelatin solution, 300 ml of aqueous solution containing 71 g of potassium bromide and 300 ml of aqueous solution containing 0.59 mole of silver nitrate were added simultaneously at the same feed rate over 50 minutes. After 1 minute, to the mixture was added 43 ml of 1% methanol solution of the following sensitizing dye (A). After 15 minutes, to the resulting mixture, 100 ml of aqueous solution containing 2.9 g of potassium iodide and 100 ml of aqueous solution containing 0.018 mole of silver nitrate were added simultaneously at the same feed rate over 5 minutes. To the emulsion was added 1.2 g of isobutylene-/monosodium maleate copolymer for sedimentation. The emulsion was washed with water for desalting. Then, 12 g of gelatin was dissolved in the emulsion. Further, 0.5 mg of sodium thiosulfate was added to the emulsion for chemical sensitization at 60° C. for 15 minutes to obtain a blue sensitive silver halide emulsion (A). The silver halide emulsion (A) is a silver iodobromide emulsion having tetradecahedral grains, uniform grain size distribution, and mean grain size of 0.22 μm. The yield of the emulsion was 1,000 g.

(Sensitizing dye (A))

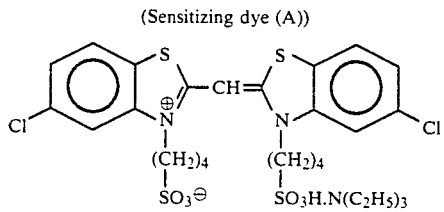

Preparation of silver halide emulsion (B)

In 1,600 ml of water were dissolved 20 g of gelatin and 0.5 g of sodium chloride, and the resulting gelatin solution was adjusted to pH 3.2 using 1N sulfuric acid and kept at 42° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the mixture was added 48 ml of 1% methanol solution of the following sensitizing dye (B). After 10 minutes, to the resulting mixture, 100 ml of aqueous solution containing 2.9 g of potassium iodide and 100 ml of aqueous solution containing 0.018 mole of silver nitrate were added simultaneously at the same feed rate over 5 minutes. To the emulsion was added 1.2 g of isobutylene/monosodium maleate copolymer for sedimentation. The emulsion was washed with water for desalting. Then, 18 g of gelatin was dissolved in the emulsion. Further, 0.7 mg of sodium thiosulfate was added to the emulsion for chemical sensitization at 60° C. for 15 minutes to obtain a green sensitive silver halide emulsion (B). The silver halide emulsion (B) is a silver iodobromide emulsion having tetradecahedral grains, uniform grain size distribution, and mean grain size of 0.12 μm. The yield of the emulsion was 1,000 g.

(Sensitizing dye (B))

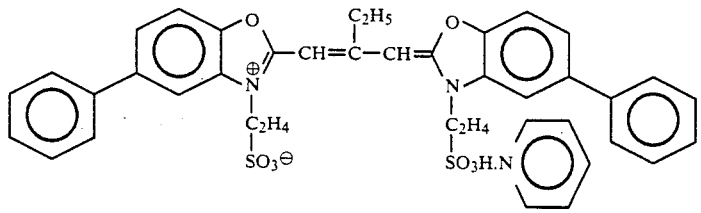

Preparation of silver halide emulsion (C)

In 1,600 ml of water were dissolved 20 g of gelatin and 0.5 g of sodium chloride, and the resulting gelatin solution adjusted to pH 3.5 using 1N sulfuric acid and kept at 45° C. To the gelatin solution, 200 ml of aqueous solution containing 71 g of potassium bromide and 200 ml of aqueous solution containing 0.59 mole of silver nitrate were added simultaneously at the same feed rate over 30 minutes. After 1 minute, to the mixture was added 48 ml of 0.5% methanol solution of the following sensitizing dye (C). After 15 minutes, to the resulting mixture, 100 ml of aqueous solution containing 3.65 g of potassium iodide and 100 ml of aqueous solution containing 0.022 mole of silver nitrate were added simultaneously at the same feed rate over 5 minutes. To the emulsion was added 1.2 g of isobutylene/monosodium maleate copolymer for sedimentation. The emulsion was washed with water for desalting. Then, 10 g of gelatin was dissolved in the emulsion. Further, 0.45 mg of sodium thiosulfate was added to the emulsion for chemical sensitization at 55° C. for 20 minutes to obtain a green sensitive silver halide emulsion (C). The silver halide emulsion (C) is a silver iodobromide emulsion having tetradecahedral grains, uniform grain size distribution, and mean grain size of 0.13 μm. The yield of the emulsion was 1,000 g.

(Sensitizing dye (C))

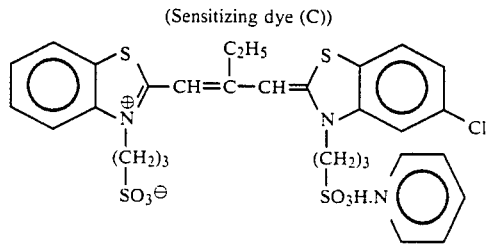

Preparation of light-sensitive composition (A)

In 100 g of trimethylolpropane triacrylate (polymerizable compound) were dissolved 15 g of the following yellow color image forming substance to obtain an oily phase.

To 60 g of the oily phase was added 1.8 g of the following copolymer. To the mixture was further added 16.6 g of the aqueous dispersion of the base precursor. The mixture was stirred at 7,000 r.p.m. for 60 minutes using a homogenizer to emulsify the aqueous dispersion in the oily phase. In the stirring process, almost of water contained in the aqueous dispersion was evaporated, and a part of water remained in the obtained emulsion.

In 59 g of the resulting emulsion was dissolved 3.9 g of the following hydrazine derivative (reducing agent), 3.3 g of the following developing agent (reducing agent), 0.05 g of the following precursor of mercapto compound, 0.01 g of the following mercapto compound and 0.5 g of the following surface active agent. To the solution was further added 8 g of the silver halide emulsion (A) and 1.3 g of 10% aqueous solution of potassium bromide. The mixture was stirred at 10,000 r.p.m. for 10 minutes at 40° C. using a homogenizer to obtain a light-sensitive composition (A) in the form of a W/O emulsion.

(Yellow color image forming substance)

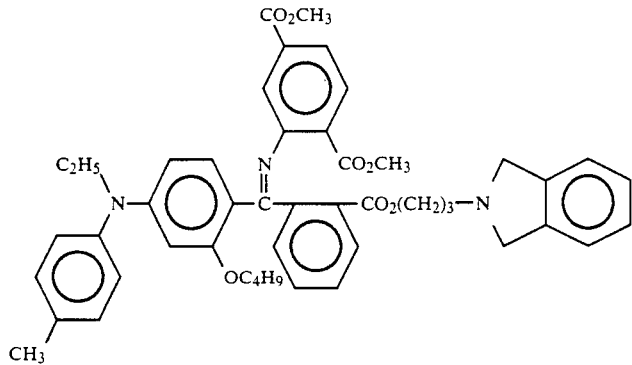

(Copolymer)

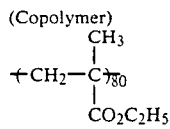

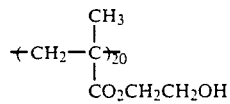

(Hydrazine derivative)

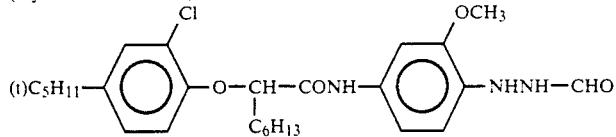

(Developing agent)

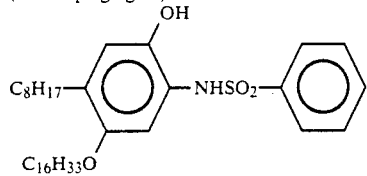

(Precursor of mercapto compound)

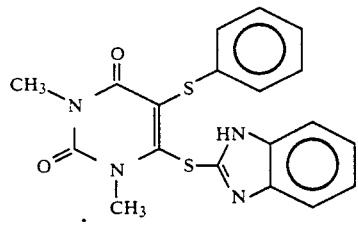

(Mercapto compound)

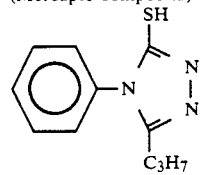

(Surface active agent)

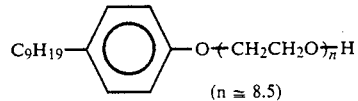

(n ≈ 8.5)

Preparation of light-sensitive composition (B)

A light-sensitive composition (B) was prepared in the same manner as in the preparation of the light-sensitive composition (A) except that 24 g of the following magenta color image forming substance was used in place of the yellow color image forming substance, the amount of the mercapto compound was changed from 0.01 g to 0.015 g, and 8 g of the silver halide emulsion (B) was used in place of the silver halide emulsion (A).

(Magenta color image forming substance)

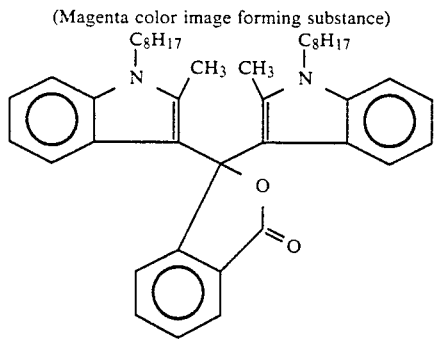

Preparation of light-sensitive composition (C)

A light-sensitive composition (C) was prepared in the same manner as in the preparation of the light-sensitive composition (A) except that 19 g of the following cyan color image forming substance was used in place of the yellow color image forming substance, the amount of the mercapto compound was changed from 0.01 g to 0.0075 g, and 8 g of the silver halide emulsion (C) was used in place of the silver halide emulsion (A).

(Cyan color image forming substance)

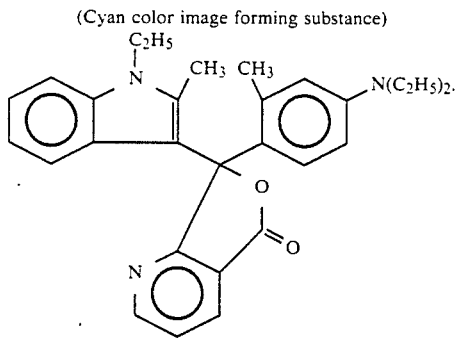

Preparation of light-sensitive microcapsule (A)

In the light-sensitive composition (A) was dissolved 4.8 g of an isocyanate compound (Takenate D110N of Takeda Chemical Industries, Ltd.). The resulting solution was added to 113 g of 10% aqueous solution of partial sodium salt of polystyrene sulfonic acid (trade name: VERSA TL502, available from National Starch, Co.). The resulting mixture was stirred at 7,000 r.p.m. at 40° C. for 30 minutes using a homogenizer to emulsify the light-sensitive composition in the aqueous medium.

Independently, to 186 g of water were added 34.5 g of melamine and 57 g of 37% aqueous solution of formaldehyde, and the resulting mixture was stirred at 600 r.p.m. at 60° C. for 30 minutes to obtain melamine-formaldehyde precondensate.

To the above-prepared emulsion was added 32 g of the precondensate, and the resulting mixture was adjusted to pH 6.0 under stirring. The mixture was then heated to 60° C. and stirred at 1,200 r.p.m. for 90 minutes. The mixture was further adjusted to pH 7.0 to obtain a dispersion of a light-sensitive microcapsule (A).

Preparation of light-sensitive microcapsule (B)

A dispersion of a light-sensitive microcapsule (B) was prepared in the same manner as in the preparation of the dispersion of the light-sensitive microcapsule (A) except that the light-sensitive composition (B) was used in place of the light-sensitive composition (A).

Preparation of light-sensitive microcapsule (C)

A dispersion of a light-sensitive microcapsule (C) was prepared in the same manner as in the preparation of the dispersion of the light-sensitive microcapsule (A) except that the light-sensitive composition (C) was used in place of the light-sensitive composition (A).

Preparation of paper support

In a refiner, 20 weight parts of laubholz bleached sulfite pulp (LBSP) and 80 weight parts of laubholz bleached kraft pulp (LBKP) were beaten to obtain a pulp having Canadian standard freeness of 290 cc. To the resulting pulp were added 0.3 weight part of an alkylketene dimer (Aquapel 12, trademark of DIC-HERCULES Co., Ltd.) as a neutral size, 0.5 weight part of polyamide-polyamine-epichlorohydrin (Kymene 557, trademark of DIC-HERCULES Co., Ltd.) as a fixing agent and 0.5 weight part of cationated polyacrylamide (Polystrone, trademark of Arakawa Chemical Industry, Co., Ltd.) as paper strengthening agent to obtain a paper stuff, in which the term "part" means a dry weight ratio to one weight part of pulp. A base paper sheet having basis weight of 60 g/m² and thickness of 66 μm was prepared from the obtained paper stuff using Fourdrinier paper machine.

On the surface (felt side) of the base paper sheet was coated polyvinylidene chloride in a coating amount of 16 g/m² using air-knife coating method to form a moisture-proofing layer. On the surface of the moisture-proofing layer was coated a mixture of 100 weight parts of SBR latex (SN-304 produced by Sumitomo Naugatac Co., Ltd.), 1 weight part of sodium polyacrylate (Arone T 40 produced by Toagosei Chemical Industry Co., Ltd.), 200 weight parts of clay (UW-90, produced by Engelhard Co., Ltd.) and 100 weight parts of petroleum resin (Carbomule R produced by DIC-HERCULES Co., Ltd.) in a coating amount of 5 g/m² using air-knife coating method to obtain a paper support.

Preparation of light-sensitive material

To the mixture of 10 g of the microcapsule dispersion (A), 10 g of the microcapsule dispersion (B) and 10 g of the microcapsule dispersion (C) were added 2 g of 5% aqueous solution of the previously used surface active agent, 2.5 g of 40% aqueous solution of urea and 40 g of water to prepare a coating solution for a light-sensitive layer.

The coating solution was coated over the paper support and dried to form a light-sensitive layer having dry thickness of about 10 μm. Thus, a light-sensitive material was prepared.

Preparation of image-receiving material

In 123 g of water was dissolved 2.5 g of sodium hexametaphosphate, and to the solution were further added 22 g of zinc 3,5-di-α-methylbenzylsalicylate and 53 g of 55% slurry of calcium carbonate. The resulting mixture was then dispersed in Dynomill dispersing device. To 40 g of the resulting dispersion were added 10 g of 8% aqueous solution of polyvinyl alcohol, 4 g of 10% aqueous solution of gelatin, 1.6 g of zinc chloride and 34 g of water and the resulting mixture was made uniform to obtain a coating solution for an image-receiving layer. The coating solution was uniformly coated on an art paper having basis weight of 43 g/m² to give a coating layer having wet thickness of 90 μm. The coated layer was dried to prepare an image-receiving material.

Evaluation of light-sensitive material

The above-prepared light-sensitive material was imagewise exposed to light using a halogen lamp at 2,000 lux for 1 second through a step wedge. The light-sensitive material was heated at 155° C. The light-sensitive materials was then combined with the image-receiving material and they were pressed through a press roller at pressure of 500 kg/cm². A positive image (positive to the black wedge) was obtained on the image receiving material. The minimum heating time required to obtain a clear image having a minimum density of not more than 0.1 was about 7 seconds.

COMPARISON EXAMPLE 1

Preparation of light-sensitive composition (A)

In 100 g of trimethylolpropane triacrylate (polymerizable compound) were dissolved 15 g of the yellow color image forming substance used in the Example 1 to obtain an oily phase.

In 49 g of the oily phase were dissolved 1.8 g of the copolymer used in Example 1, 3.9 g of the hydrazine derivative used in Example 1, 3.3 g of the developing agent used in Example 1, 0.05 g of the precursor of mercapto compound used in Example 1, 0.01 g of the mercapto compound used in Example 1 and 0.5 g of the surface active agent used in Example 1. To the solution was further added 8 g of the silver halide emulsion (A) and 1.3 g of 10% aqueous solution of potassium bromide. The mixture was stirred at 10,000 r.p.m. for 10 minutes at 40° C. using a honmogenizer to obtain a light-sensitive composition (A) in the form of a W/O emulsion.

Preparation of light-sensitive composition (B)

A light-sensitive composition (B) was prepared in the same manner as in the preparation of the light-sensitive composition (A) except that 24 g of the magenta color image forming substance used in Example 1 was used in place of the yellow color image forming substance, the amount of the mercapto compound was changed from 0.01 g to 0.015 g, and 8 g of the silver halide emulsion (B) was used in place of the silver halide emulsion (A).

Preparation of light-sensitive composition (C)

A light-sensitive composition (C) was prepared in the same manner as in the preparation of the light-sensitive composition (A) except that 19 g of the cyan color image forming substance used in Example 1 was used in place of the yellow color image forming substance, the amount of the mercapto compound was changed from 0.01 g to 0.0075 g, and 8 g of the silver halide emulsion (C) was used in place of the silver halide emulsion (A).

Preparation of light-sensitive microcapsules

Dispersions of light-sensitive microcapsules (A), (B) and (C) were prepared in the same manner as in the Example 1 except that the above-prepared light-sensitive compositions (A), (B) and (C) were respectively used.

Preparation of aqueous dispersion of base precursor

In 800 g of 3 weight % aqueous solution of polyvinyl alcohol was dispersed 200 g of powder of the base precursor used in Example 1 using Dynomill dispersing device to obtain an aqueous dispersion of the base precursor.

Preparation of light-sensitive material

To the mixture of 10 g of the microcapsule dispersion (A), 10 g of the microcapsule dispersion (B) and 10 g of the microcapsule dispersion (C) were added 7 g of the aqueous dispersion of the base precursor, 2 g of 5% aqueous solution of the surface active agent used in Example 1, 2.5 g of 40% aqueous solution of urea and 33 g of water to prepare a coating solution for a light-sensitive layer.

The coating solution was coated over the paper support used in Example 1 and dried to form a light-sensitive layer having dry thickness of about 10 μm. Thus, a light-sensitive material wherein the base precursor is arranged outside of the microcapsule was prepared.

Evaluation of light-sensitive material

The above-prepared light-sensitive material was evaluated in the same manner as in Example 1. As a result, the minimum heating time required to obtain a clear image having a minimum density of not more than 0.1 was about 17 seconds.

COMPARISON EXAMPLE 2

Preparation of light-sensitive composition (A)

In 100 g of trimethylolpropane triacrylate (polymerizable compound) were dissolved 15 g of the yellow color image forming substance used in the Example 1 to obtain an oily phase.

In 85 g of the oily phase was dispersed 15 g of the powder of the base precursor used in Example 1 (almost insoluble in the oily phase) using Dynomill dispersing device. The mean particle size of the base precursor was not more than 0.5 μm.

In 59 g of the resulting oily phase were dissolved 1.8 g of the copolymer used in Example 1, 3.9 g of the hydrazine derivative used in Example 1, 3.3 g of the developing agent used in Example 1, 0.05 g of the precursor of mercapto compound used in Example 1, 0.01 g of the mercapto compound used in Example 1 and 0.5 g of the surface active agent used in Example 1. To the solution was further added 8 g of the silver halide emulsion (A) and 1.3 g of 10% aqueous solution of potassium bromide. The mixture was stirred at 10,000 r.p.m. for 10 minutes at 40° C. using a homogenizer to obtain a light-sensitive composition (A) in the form of a W/O emulsion.

Preparation of light-sensitive composition (B)

A light-sensitive composition (B) was prepared in the same manner as in the preparation of the light-sensitive composition (A) except that 24 g of the magenta color image forming substance used in Example 1 was used in place of the yellow color image forming substance, the amount of the mercapto compound was changed from 0.01 g to 0.015 g, and 8 g of the silver halide emulsion (B) was used in place of the silver halide emulsion (A).

Preparation of light-sensitive composition (C)

A light-sensitive composition (C) was prepared in the same manner as in the preparation of the light-sensitive composition (A) except that 19 g of the cyan color image forming substance used in Example 1 was used in place of the yellow color image forming substance, the amount of the mercapto compound was changed from 0.01 g to 0.0075 g, and g of the silver halide emulsion (C) was used in place of the silver halide emulsion (A).

Preparation of light-sensitive microcapsules

Dispersions of light-sensitive microcapsules (A), (B) and (C) were prepared in the same manner as in the Example except that the above-prepared light-sensitive compositions (A), (B) and (C) were respectively used.

Preparation of light-sensitive material

A light-sensitive material prepared in the same manner as in Example 1 except that the above-prepared microcapsule dispersions (A), (B) and (C) were used.

Evaluation of light-sensitive material

The above-prepared light-sensitive material was evaluated in the same manner as in Example 1. As a result, even if the light-sensitive material was heated for 30 seconds, the minimum density was 0.7 and no clear image was obtained.

It is apparent from the results of Example 1 and Comparison Examples 1 & 2 that the light-sensitive material prepared according to the present invention has a high development speed and a high sensitivity.

EXAMPLE 2

The silver halide emulsions and the light-sensitive compositions were prepared in the same manner as in Example 1.

To 50 g of 10% aqueous solution of polyvinyl alcohol was added 10 g of the light-sensitive composition (A), and the mixture was stirred at 5,000 r.p.m. for 5 minutes using a homogenizer to obtain a light-sensitive emulsion (A). Light-sensitive emulsions (B) and (C) were prepared in the same manner as in the preparation of the light-sensitive emulsion (C) except that the light-sensitive compositions (B) and (C) were respectively used.

A mixture of 10 g of the light-sensitive emulsion (A), 10 g of the light-sensitive emulsion (B), 10 g of the light-sensitive emulsion (C) and 40 g of water was coated over the paper support used in Example 1 and dried to form a light-sensitive layer having dry thickness of about 10 μm.

The light-sensitive material was then evaluated in the same manner as in Example 1. As a result, a black positive image was formed on the image-receiving material.

EXAMPLE 3

The silver halide emulsion (B) was prepared in the same manner as in Example 1.

A composition (B) was prepared in the same manner as in the preparation of the light-sensitive composition (B) in Example 1, except that the silver halide emulsion (B) and the aqueous solution of potassium bromide were not used.

To 50 g of 10% aqueous solution of polyvinyl alcohol was added 10 g of the composition (B), and the mixture was stirred at 5,000 r.p.m. for 5 minutes using a homogenizer to obtain an emulsion (B).

A mixture of 30 g of the emulsion (B), 0.5 g of the silver halide emulsion (B) and 40 g of water was coated over the paper support used in Example 1 and dried to form a light-sensitive layer having dry thickness of about 10 μm.

The light-sensitive material was then evaluated in the same manner as in Example 1. As a result, a magenta positive image was formed on the image-receiving material.

What is claimed is:

1. A process for preparation of a light-sensitive material comprising a support and a light-sensitive layer provided thereon which contains light-sensitive silver halide, a reducing agent, a base precursor and an ethylenic unsaturated polymerizable compound, wherein the process includes a step of emulsifying an aqueous dispersion of solid particles of the base precursor having a mean particle size in the range of 0.01 to 30 μm in an oily medium containing the polymerizable compound in the range of 0.1 to 100 weight %, said base precursor having a solubility of not more than 3% in each of water and the oily medium.

2. The process for preparation as claimed in claim 1, wherein the process comprises the steps of:

emulsifying an aqueous dispersion of the base precursor and a light-sensitive silver halide emulsion in an oily medium containing the polymerizable compound in the range of 0.1 to 100 weight %;

emulsifying the obtained oily emulsion in an aqueous medium; and coating the obtained aqueous emulsion on the support, and the reducing agent is added to one selected from the group consisting of the oily medium, the aqueous dispersion of the base precursor, the light-sensitive silver halide emulsion, the oily emulsion, the aqueous medium and the aqueous emulsion.

3. The process for preparation as claimed in claim 2, wherein the aqueous emulsion obtained by emulsifying the oily emulsion in an aqueous medium is subjected to a process for forming shells of microcapsules.

4. The process for preparation as claimed in claim 1, wherein the process comprises the steps of:

emulsifying an aqueous dispersion of the base precursor in an oily medium containing the polymerizable compound in the range of 0.1 to 100 weight %;

emulsifying the obtained oily emulsion in an aqueous medium containing a light-sensitive silver halide emulsion, or adding a light-sensitive silver halide emulsion to an aqueous emulsion obtained by emulsifying the oily emulsion in an aqueous medium; and coating the obtained aqueous emulsion on the support, and the reducing agent is added to one selected from the group consisting of the oily medium, the aqueous dispersion of the base precursor, the light-sensitive silver halide emulsion, the oily emulsion, the aqueous medium and the aqueous emulsion.

5. The process for preparation as claimed in claim 4, wherein the aqueous emulsion obtained by emulsifying the oily emulsion in an aqueous medium is subjected to a process for forming shells of microcapsules.

6. The process for preparation as claimed in claim 1, wherein the process comprises the steps of:

emulsifying an aqueous dispersion of the base precursor in an oily medium containing the polymerizable compound in the range of 0.1 to 100 weight %;

emulsifying the obtained oily emulsion in an aqueous medium;

coating the obtained aqueous emulsion on the support; and coating a light-sensitive silver halide emulsion on the coated layer, and the reducing agent is added to one selected from the group consisting of the oily medium, the aqueous dispersion of the base precursor, the light-sensitive silver halide emulsion, the oily emulsion, the aqueous medium and the aqueous emulsion.

7. The process for preparation as claimed in claim 6, wherein the aqueous emulsion obtained by emulsifying the oily emulsion in an aqueous medium is subjected to a process for forming shells of microcapsules.

8. The process for preparation as claimed in claim 1, wherein the process comprises the steps of:

emulsifying an aqueous dispersion of the base precursor and a light-sensitive silver halide emulsion in an oily medium containing the polymerizable compound in the range of 0.1 to 100 weight %; and coating the obtained oily emulsion on the support, and the reducing agent is added to one selected from the group consisting of the oily medium, the aqueous dispersion of the base precursor, the light-sensitive silver halide emulsion and the oily emulsion.

9. The process for preparation as claimed in claim 8, wherein the oily medium contains an oil-soluble polymer in the range of 0.1 to 90 weight %.

10. The process for preparation as claimed in claim 1, wherein the process comprises the steps of:

emulsifying an aqueous dispersion of the base precursor in an oily medium containing the polymerizable compound in the range of 0.1 to 100 weight %; and coating the obtained oily emulsion on the support; and coating a light-sensitive silver halide emulsion on the coated layer, and the reducing agent is added to one selected from the group consisting of the oily medium, the aqueous dispersion of the base precursor, the light-sensitive silver halide emulsion and the oily emulsion.

11. The process for preparation as claimed in claim 10, wherein the oily medium contains an oil-soluble polymer in the range of 0.1 to 90 weight %.

12. The process for preparation as claimed in claim 1, wherein the base precursor is a salt of an organic base with a carboxylic acid.

13. The process for preparation as claimed in claim 1, wherein the base precursor is a salt of an organic base with a carboxylic acid, and the organic base is a diacidic to tetraacidic base which is composed of two to four amidine moieties and at least one residue of a hydrocarbon or a heterocyclic ring as a linking group for the amidine moieties, said amidine moiety corresponding to an atomic group formed by removing one or two hydrogen atoms from an amidine having the following formula (I):

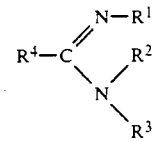

wherein each of $R^1$, $R^2$, $R^3$ and $R^4$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^1$, $R^2$, $R^3$ and $R^4$ may be combined together to form a five-membered or six-membered heterocyclic ring consisting of nitrogen and carbon atoms.

14. The process for preparation as claimed in claim 1, wherein the base precursor is a salt of an organic base with a carboxylic acid, and the organic base is a diacidic to tetraacidic base which is composed of two to four guanidine moieties and at least one residue of a hydrocarbon or a heterocyclic ring as a linking group for the guanidine moieties, the number of carbon atoms contained in said organic base being not more than six times the number of the guanidine moieties, and said guanidine moiety corresponding to an atomic group formed by removing one or two hydrogen atoms from a compound having the following formula (IV):

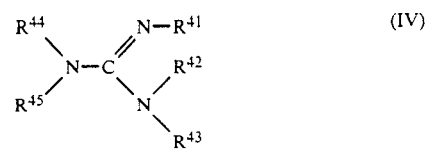

wherein each of $R^{41}$, $R^{42}$, $R^{43}$, $R^{44}$ and $R^{45}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent groups, and any two of $R^{41}$, $R^{42}$, $R^{43}$, $R^{44}$ and $R^{45}$ may be combined together to form a five-membered or six-membered heterocyclic ring.

15. The process for preparation as claimed in claim 1, wherein a color image forming substance is added to the light-sensitive material.

16. The process for preparation as claimed in claim 1, wherein a thermal polymerization initiator is added to the light-sensitive material.

17. The process for preparation as claimed in claim 1, wherein a photopolymerization initiator is added to the light-sensitive material.

18. The process for preparation as claimed in claim 1, wherein a hydrophilic polymer is dissolved in the aqueous dispersion of the base precursor.

19. The process for preparation as claimed in claim 1, wherein the base precursor is contained in the aqueous dispersion in the range of 1 to 90 weight %.

20. The process for preparation as claimed in claim 1, wherein the base precursor is used in an amount of 0.5 to 200 weight % based on the amount of the polymerizable compound.

* * * * *